(12) United States Patent
Bash et al.

(10) Patent No.: US 6,817,204 B2
(45) Date of Patent: Nov. 16, 2004

(54) MODULAR SPRAYJET COOLING SYSTEM

(75) Inventors: Cullen E. Bash, San Francisco, CA (US); Abdlmonem H. Beitelmal, Sunnyvale, CA (US); Chandrakant D. Patel, Fremont, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/684,884

(22) Filed: Oct. 14, 2003

(65) Prior Publication Data

US 2004/0118143 A1 Jun. 24, 2004

Related U.S. Application Data

(63) Continuation of application No. 09/945,044, filed on Aug. 31, 2001, now Pat. No. 6,644,058.
(60) Provisional application No. 60/271,271, filed on Feb. 22, 2001.

(51) Int. Cl.[7] ............................................. F28D 5/00
(52) U.S. Cl. .................. 62/304; 62/259.2; 165/104.33; 361/699
(58) Field of Search ................ 62/304, 310, 259.2, 62/171, 132; 165/80.4, 104.33; 361/693, 699

(56) References Cited

U.S. PATENT DOCUMENTS

| | | | |
|---|---|---|---|
| 2,643,282 A | 6/1953 | Greene | 174/15 |
| 2,849,523 A | 8/1958 | Narbut | 174/15 |
| 2,858,355 A | 10/1958 | Narbut | 174/15 |
| 2,875,263 A | 2/1959 | Narbul | 174/15 |
| 4,141,224 A | 2/1979 | Alger et al. | 62/514 R |
| 4,290,274 A | 9/1981 | Essex | 62/157 |
| 4,352,392 A | 10/1982 | Eastman | 165/104.25 |
| 4,490,728 A | 12/1984 | Vaught et al. | 346/1.1 |
| 4,500,895 A | 2/1985 | Buck et al. | 346/140 R |
| 4,559,789 A | 12/1985 | Riek | 62/157 |
| 4,576,012 A | 3/1986 | Luzenberg | 62/157 |
| 4,683,481 A | 7/1987 | Johnson | 346/140 R |
| 4,685,308 A | 8/1987 | Welker et al. | 62/171 |
| 4,794,410 A | 12/1988 | Taub et al. | 346/140 R |
| 5,220,804 A | 6/1993 | Tilton et al. | 62/64 |
| 5,278,584 A | 1/1994 | Keefe et al. | 346/140 R |
| 5,434,606 A | 7/1995 | Hindagolla et al. | 347/45 |
| 5,718,117 A | 2/1998 | McDunn et al. | 62/64 |
| 5,724,824 A | 3/1998 | Parsons | 62/171 |
| 5,768,103 A * | 6/1998 | Kobrinetz et al. | 361/699 |
| 5,907,473 A | 5/1999 | Przilas et al. | 361/699 |
| 5,924,198 A | 7/1999 | Swanson et al. | 29/890.1 |
| 5,943,211 A | 8/1999 | Havey et al. | 361/699 |
| 6,108,201 A | 8/2000 | Tilton et al. | 361/689 |
| 6,182,742 B1 | 2/2001 | Takahashi et al. | 165/104.33 |
| 6,205,799 B1 | 3/2001 | Patel et al. | 62/132 |

FOREIGN PATENT DOCUMENTS

| | | | |
|---|---|---|---|
| EP | 509844 A1 | 10/1992 | 165/104.33 |
| JP | 56-137086 | 10/1981 | 165/104.33 |

OTHER PUBLICATIONS

Sehmbey, M.S., Pais, M.R. and Chow, L.C., "Effect of Surface Material Properties and Surface Characteristics in Evaporative Spray Cooling," The Journal of Thermophysics & Heat Transfer, Jul.–Sep., 1992, vol. 6, No. 3, pp 505–511.

(List continued on next page.)

Primary Examiner—Melvin Jones (57) ABSTRACT

A modular semiconductor chip cooling system having a readily openable enclosure defining a chamber configured to hold a printed circuit board carrying components to be cooled. The enclosure can include a reservoir, a condenser and a pump. Sprayers within the chamber are adjustably mounted on one or more brackets to allow each sprayer to be set for the individual height of its respective component. The enclosure can be readily removed from a computer system through a quick release connection. The computer system can include a condenser and pump to operate all its modular cooling systems, removing the condensing function from the individual modules.

14 Claims, 4 Drawing Sheets

OTHER PUBLICATIONS

Pais, Martin R., Chang, Ming J., Morgan, Michael J. and Chow, Louis C., Spray Cooling of a High Power Laser Diode, SAE Aerospace Atlanta Conference & Exposition, Dayton, Ohio, 1994, pp 1–6.

Morgan, Michael J., Chang, Won S., Pals, Martin R. and Chow, Louis C., "Comparison of High Heat–Flux Cooling Applications," SPIE, 1992, vol. 1739, pp17–28.

Lee, Chin C., and Chlen, David H., "Thermal and Package Design of High Power Laser Diodes," IEEE, 1993, Ninth IEEE Semi–Therm Symposium, pp 75–80.

Sehmbey, Mainder S., Chow, Louis C., Pais, Martin R. and Mahefkey, Tom, "High Heat Flux Spray Cooling of Electronics," American Institute of Physics, Jan., 1995, pp 903–909.

Mudawar, I. and Estes, K.A., "Optimizing and Predicting CHF in Spray Cooling of a Square Surface," Journal of Heat Transfer, Aug., 1996, vol. 118, pp 672–679.

Denney, D. Lawrence, "High Heat Flux Cooling Via a Monodisperse Controllable Spray", A Thesis Presented to The Academic Faculty of Georgia Institute of Technology in Partial Fulfillment of the Requirements for the Degree Master of Science in Mechanical Engineering, Mar. 1996.

\* cited by examiner

MODULAR SPRAYJET COOLING SYSTEM

The present application is a continuation of application Ser. No. 09/945,044, filed on Aug. 31, 2001 now U.S. Pat. No. 6,644,058, which is hereby incorporated by reference herein for all purposes, and which claims priority from U.S. provisional patent application No. 60/271,271, filed Feb. 22, 2001, which is also incorporated herein by reference for all purposes.

The present invention relates generally to cooling systems for heat-generating devices and, more particularly, to a modular spray cooling system and a method of using the spray cooling system to cool a semiconductor device.

BACKGROUND OF THE INVENTION

With the advent of semiconductor devices having increasingly large component densities, the removal of heat generated by the devices has become an increasingly challenging technical issue. Extrapolating the ongoing changes in microprocessor organization and device miniaturization, one can project future power dissipation requirements of 100 W from a 1 cm by 1 cm core CPU surface area within the easily foreseeable future.

Highly available computer systems, to prolong a customer's investment, are designed to both be maintained for long periods and to be easily maintained over time. This makes it preferable that a computer system is well cooled across all of its components on each board, and that the computer can quickly and readily accept replacements for malfunctioning boards. Typical processor boards sometimes include multiple CPU modules, application-specific integrated circuits (ICs), and one or more types of memory such as static random access memory (SRAM), as well as dc—dc converters, all of which have different and extreme power dissipation requirements. Adding to the complexity, the variety of chip types on typical processor boards provides for chip surfaces at a variety of heights off the board's surface.

In the past, the low power dissipation of the processors accommodated the use of low cost, air-cooled heat sinks that require minimal re-design effort. However, with higher dissipation requirements come more complex cooling systems that make both the even cooling requirements and the serviceability of a board a more complex issue. In particular, different components stand up off the board with different heights, which causes board-wide cooling systems to cool different components to different degrees, even if the components' power dissipation levels are similar, which typically is not the case.

Figure 1:
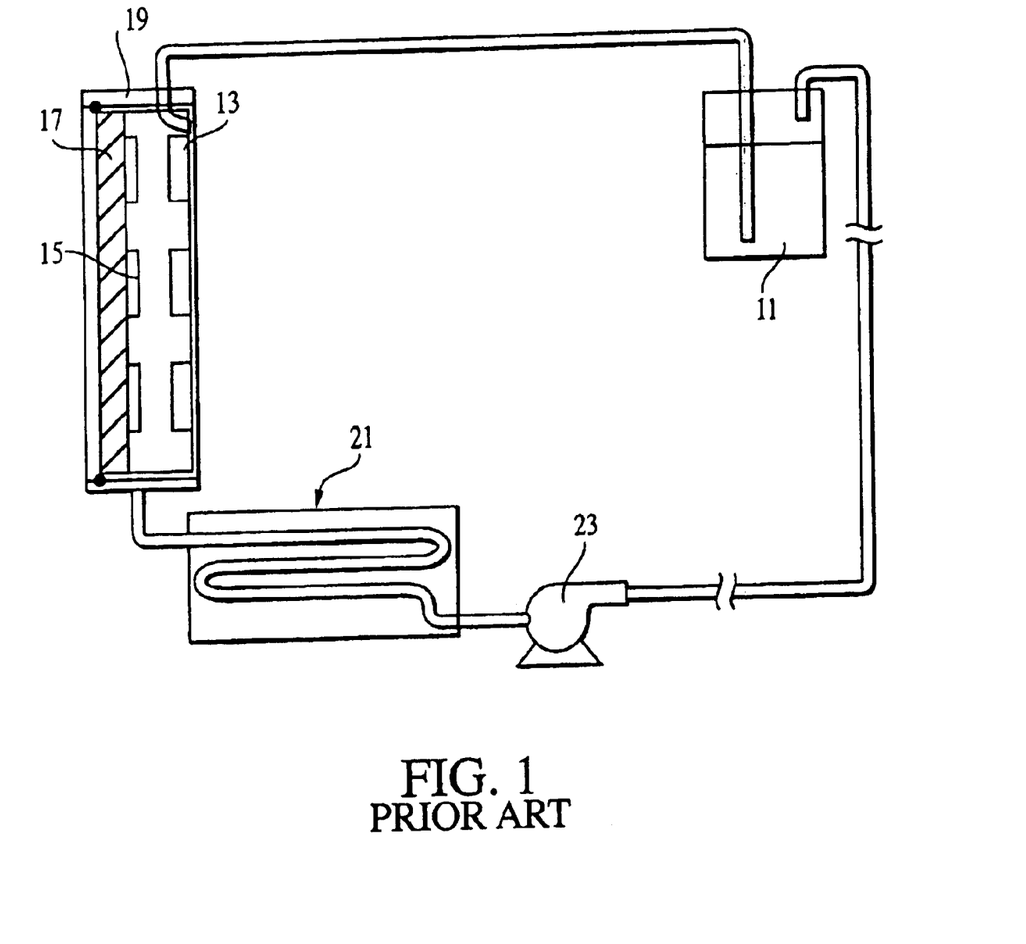
FIG. 1 is a system layout of a spray cooling system.

Spray cooling technologies, such as are described in U.S. Pat. No. 6,205,799, which is incorporated herein by reference for all purposes, can offer high dissipation levels that meet extreme cooling requirements. With reference to FIG. 1, in spray cooling, an inert spray coolant from a reservoir 11 is preferably sprayed by sprayers 13 onto chips 15 mounted on a printed circuit board 17. The coolant preferably evaporates, dissipating heat within the chip. The sprayers and chips, and the board, are mounted within sealed cases 19 fixed within a computer system. The sprayed coolant is typically gathered and cooled within a condenser 21, and then routed back to the reservoir by a pump 23.

The cases are evacuated systems with robust closure systems. Access to the components for maintenance can typically be had only through extensive disassembly of the computer system and case, which is significantly more time consuming and costly than the maintenance of standard air-cooled chips. Thus, for a liquid cooled board, board replacement becomes a complex issue that must deal with the presence of liquid, and potentially the need for an evacuated system.

Furthermore, it is known that the thermal performance achieved from spray cooling is dependant upon the distance between the firing nozzle and the hot surface. A greater distance allows for more of the cooling fluid to evaporate prior to reaching the chip. Furthermore, drag reduces the speed of the droplets, allowing even more cooling fluid to evaporate prior to reaching the chip. The evaporation of cooling fluid prior to reaching the chip reduces the fluid flow rate received by the chip, and thus reduces the thermal performance of the spray cooling system. The reduced speed of the droplets also reduces their momentum, and thus their ability to penetrate vapor barriers, such as can form at near-maximum levels of heat flux for a spray-cooling system.

Since processor boards can and often do contain components of dissimilar heights, it has been suggested that the hottest component be used as the reference component to determine the sprayjet cartridge-to-board; spacing. The primary disadvantage of this technique is that fluid may be delivered inefficiently to other hot components of markedly different heights from the reference component.

Accordingly, there has existed a need for an easily maintainable spray cooling system that maximizes spray cooling efficiency for a plurality of components on a single printed circuit board. Preferred embodiments of the present invention satisfy these and other needs, and provide further related advantages.

SUMMARY OF THE INVENTION

In various embodiments, the present invention solves some or all of the needs mentioned above by providing a cooling system that efficiently operates on one or possibly more high-dissipation devices with relatively simple maintenance.

The invention can include or form a modular sprayjet cooling system configured for cooling one or more components (e.g., electrical components) on a board by spraying the one or more components with a cooling fluid during the components operation. The invention features an enclosure that defines an internal chamber configured to contain the board. An electrical connector within the chamber is configured to electrically connect to the board, enabling the operation of the components. A sprayer is located within the chamber, and it is configured to spray one or more of the components with the cooling fluid to cool them. During operation, the chamber is closed and sealed such that cooling fluid cannot leak out of the chamber.

A feature of the invention is that the chamber can be readily opened and closed by hand for external access to the chamber. When the chamber is opened, the board can be readily removed and replaced, by hand or with mechanical or electromechanical assistance, without risk of interfering with the operation of the rest of the electronic system containing the modular sprayjet cooling system. This feature provides for efficient replacement of the board, potentially without shutting down the entire system of which the board is a part. Thus, the invention allows for hot-pluggable replacement boards that are spray cooled.

Another feature of the invention is that the enclosure can be configured for releasably inserting into a bay of an electronic device, the bay having an electrical connector.

The enclosure includes a second electrical connector on the exterior of the enclosure, configured to mate with the electrical connector of the bay to place the board in communication with the electronic device via the first electrical connector. This feature provides for efficient replacement of the board, potentially without shutting down the entire system of which the board is a part.

Also, the invention can include or form a sprayjet cooling system for cooling one or more components on a board during operation of the components. In particular, the invention features first and second sprayers configured to spray the one or more components on the board with the cooling fluid. The invention further features an adjustment mechanism configured to support the first sprayer at a distance from the board that is adjustable relative to the distance between the second sprayer and the board. Advantageously, these features provide for efficient and effective cooling of the components on the board, taking each components height into consideration.

Other features and advantages of the invention will become apparent from the following detailed description of the preferred embodiments, taken with the accompanying drawings, which illustrate, by way of example, the principles of the invention. The detailed description of particular preferred embodiments, as set out below to enable one to build and use an embodiment of the invention, are not intended to limit the enumerated claims, but rather, they are intended to serve as particular examples of the claimed invention.

DETAILED DESCRIPTION OF THE PREFERRED EMBODIMENTS

The invention summarized above and defined by the enumerated claims may be better understood by referring to the following detailed description, which should be read with the accompanying drawings. This detailed description of particular preferred embodiments of the invention, set out below to enable one to build and use particular implementations of the invention, is not intended to limit the enumerated claims, but rather it is intended to provide particular examples of them.

Figure 2:
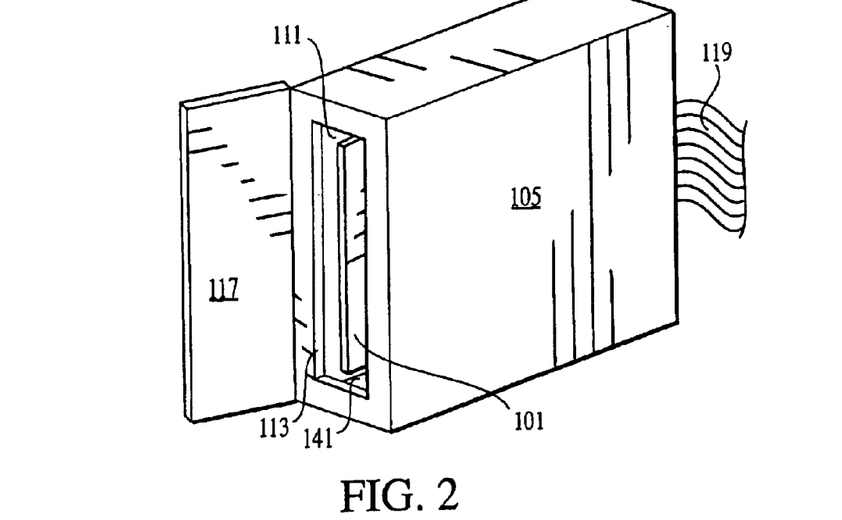
FIG. 2 is a perspective view of a first modular connection system embodying the invention.
Figure 3:
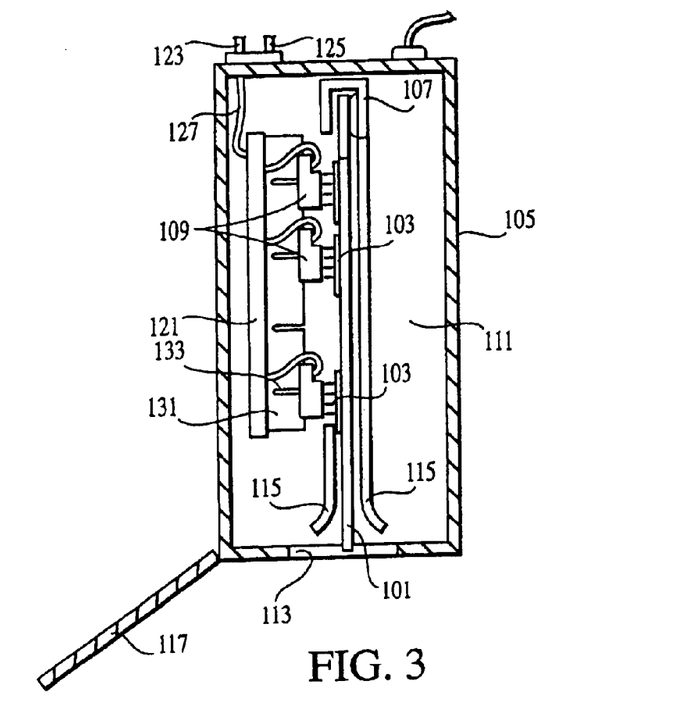
FIG. 3 is a cross-sectional view of the first modular sprayjet cooling system as depicted in FIG. 2.

With reference to FIGS. 2 and 3, a first preferred embodiment of the invention resides in a modular sprayjet cooling system. One or more modules of this embodiment can be installed as part of an electronic device (not shown) such as a computer system to provide for the use of spray cooled printed circuit boards that can be quickly and easily serviced and replaced. The module is designed to contain a printed circuit board 101 carrying one or more chips 103, and it includes apparatus for cooling the chips with a cooling fluid while the chips are in operation. Advantageously, this provides for the efficient replacement of the board, potentially without shutting down the electronic device. Thus, the invention allows for hot-pluggable replacement boards that are spray cooled.

The embodiment includes an enclosure 105, an electrical connector 107 and one or more sprayers 109. The enclosure defines an internal chamber 111, the chamber being configured to contain the board 101. The chamber can be readily opened and closed by hand for external access to the chamber. This access allows printed circuit boards to be removed and replaced while the chamber is opened. However, when the chamber is closed, the chamber is sealed such that cooling fluid cannot leak out of the chamber. The electrical connector is located within the chamber, and it is configured to electrically connect to the printed circuit board to enable the operation of the one or more chips 103. The sprayer is located within the chamber, and is configured to spray the one or more chips with cooling fluid during the chips' operation.

The enclosure 105 is preferably configured as a six-sided box with an opening 113 on one side. The opening is large enough for the printed circuit board 101 to pass through unobstructed. The enclosure is preferably mounted in a case of the electronic device such that the enclosure's opening can be opened and the board removed without any disassembly of the rest of the electronic device (or only insubstantial access-related activities such as opening an access door). Preferably there is a plurality of such modules in the electronic device, each preferably being similarly mounted as readily accessible.

Preferably the enclosure includes guides 115 that will guide the printed circuit board 101 into the chamber 111 to mate with the electrical connector 107. The board is preferably insertable and removable by hand. Alternatively, either a mechanical cam with an actuation lever can be used to dislodge the board, or a motorized device can dislodge and/or disgorge the board.

A closure, such as a door 117, is configured to close and seal the opening 113 such that the chamber is sealed to contain cooling fluid in a liquid or gaseous state without leaking. Preferably the seal is adequate to allow the chamber to be evacuated. The electrical connector 107 preferably electrically connects (i.e., allows electrical communication between) the printed circuit board and the other electrically active portions of the electronic device via a typical connector, such as a ribbon cable 119 or a connector that directly connects the enclosure to a backplane.

In some variations of the invention, it will be preferable to have a mechanism to provide for clearance between the sprayers and the chips when the board is guided into position. The mechanism can employ a guided board-insertion motion that is not coplanar with the card, such as an angled insertion pathway followed by a swinging motion to bring the board proximate the sprayers.

Alternatively, the mechanism can cause the sprayers to retract from the path of the board and its chips during their insertion and removal. The retraction mechanism could be manually activated by a technician, or it could be automatically activated upon the occurrence of an event such as the shutting down of the board or the opening of the enclosure. It could be mechanical or electromechanical. Furthermore, the mechanism could operate on the entire set of sprayers as a whole, or it could include individual retractors that each operate on a sprayer or group of sprayers, thus also serving as a bracket allowing for individual positioning of the cartridges with respect to the board.

In some cases, such as an automatic, electromechanical mechanism that operates separately on each sprayer, the mechanism could be programmable to adjust to each chip's height, and preferably configured such that boards having similar layouts with different chip heights could be automatically adjusted to. The programming for such changes could even be carried in each board, thus making the system potentially a plug-and-play cooling system that immediately and automatically adjusts to the chip-heights of the inserted board.

The one or more sprayers 109 are part of a spray cooling system that preferably includes a condenser (not shown), a pump (not shown) and a reservoir 121. The condenser and pump are preferably found outside the enclosure, and are preferably configured to condense and cool the cooling fluid from a plurality of the electronic device's modules. The cooling fluid passes between the module and the condenser and pump via an inlet port 123 and an outlet port 125. Alternatively, the condenser and pump could be built into the module and directly or indirectly affixed to the enclosure. Depending on the orientation with respect to gravity, and on constraints of the electronic and fluid delivery systems, the inlet and/or outlet ports might be preferably located in other locations than shown in the figure, such as at the bottom of the enclosure.

Preferably, each sprayer is positioned to attend to the cooling needs of its respective chip, regardless of the chip's position or the height that it extends off the printed circuit board. Embodiments of the present invention therefore preferably include mechanisms for flexibly positioning multiple sprayers relative to the printed circuit board such that each is located at an optimum distance from the printed circuit board, and most preferably such that it sprays on a particular chip. This will help maintain maximum efficiency in the delivery of the cooling fluid to each hot component.

In particular, the sprayers 109 are each preferably built into separate cartridges that preferably all share a single reservoir 121, to which they are placed in fluid communication via flexible tubing (such as TYGON® tubing from Norton Performance Plastics—Norton Company, or the like). The reservoir is filled through a feed tube 127 that places it in fluid communication with the inlet port 123.

Each cartridge is preferably attached to the reservoir via one or more brackets 131 that allows the cartridge to be positioned independent from the other cartridges. The bracket is preferably constructed to allow variances in the height of the cartridges off the surface of the circuit board, such that the sprayer to hot-component-surface spacing is optimum for each component-cartridge pair. This spacing can be controlled by affixing each cartridge to the bracket along a slot 133 that allows the cartridge to be positioned at any location along the slot.

Optionally, the bracket(s) 131 and the cartridges' attachments thereto could be constructed to allow cartridge movement in two or even three directions. Preferably the configuration allows for the cartridges' positions to mirror the placement of components on the circuit board, thereby insuring a cooling cartridge sits directly above each hot component. Such a bracket allows for the optimum placement of the cooling cartridges in a variety of configurations, thereby enabling the use of a single bracket system for a multiplicity of circuit board layouts.

Preferably each of the sprayers 109 has a plurality of nozzles that conduct incremental spraying. More preferably, the sprayers are of the thermal inkjet type. In particular, with reference to FIG. 4, which depicts two simplified, exemplary incremental inkjet-type nozzles 201, each nozzle includes structure defining a chamber 203 for receiving a predetermined portion of cooling fluid and a heater 205 for vaporizing a portion of the cooling fluid, to create the pressure to eject an incremental amount of the cooling fluid through an orifice 207 that directs the ejected cooling fluid toward the hot component 103 (FIG. 3). The orifices are preferably formed in a flexible polymer tape 209, e.g., a polyimide tape such as is sold under the mark KAPTON.®

Figure 4:
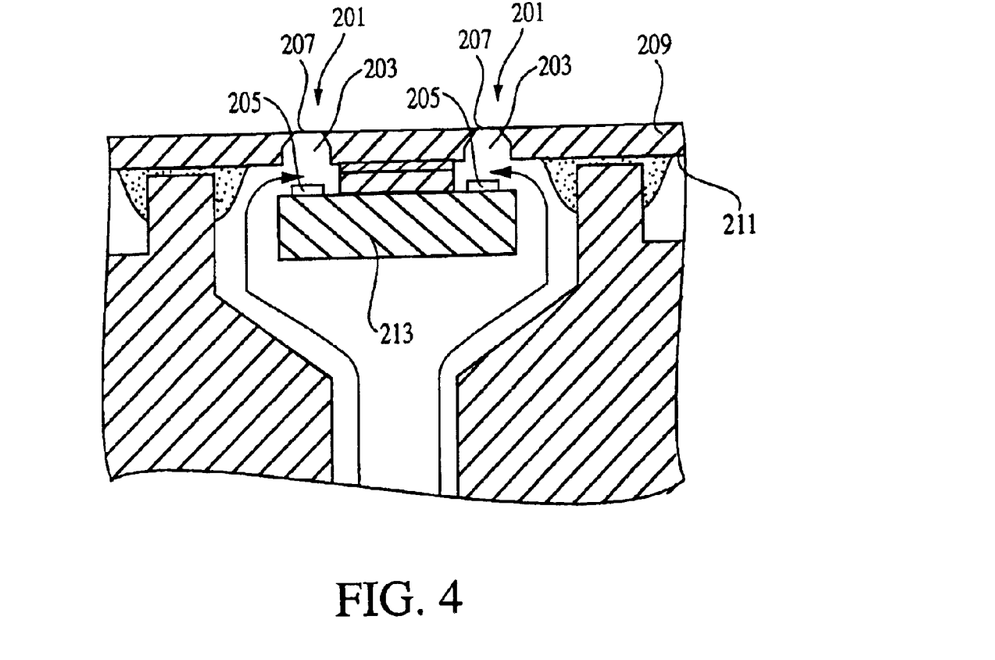
FIG. 4 is a cross-sectional view of two inkjet-type nozzles as used in the first modular connection system depicted in FIG. 2.

Affixed to a back surface 211 of the tape 209 is a silicon substrate 213 containing the heaters 205, in the form of individually energizable thin-film resistors. Each heater is preferably located on a side of the chamber 203 across from the chamber's orifice 207. Cooling fluid is preferably drawn and loaded into the chamber by capillary action, as is typical for an ink-jet type device. A computerized controller (not shown) energizes the heater, vaporizing the portion of the cooling fluid adjacent to the heater. The vaporized cooling fluid expands, expelling most of the non-vaporized cooling fluid out of the orifice, typically as a single droplet.

Depending on the configuration of the sprayer, the incremental amount of the fluid sprayed from the sprayer could be in the form of a single droplet, or in the form of multiple droplets. Multiple droplets could be produced by multiple orifices related to a single heater, or by sprayers having larger chamber volumes and appropriately shaped orifice nozzles to cause the incremental amount of fluid to break into droplets. After the chamber has been fired by the heater, capillary action again loads the chamber for a subsequent firing.

The liquid spray from the incremental sprayers can be highly controllable. For example, by increasing or decreasing the frequency that the sprayers are energized, the flow rate can be accurately adjusted. Furthermore, because the sprayers can be configured to deliver very small quantities of cooling fluid, and because many sprayers can be fit into a small area, the heat distribution over that area can be accurately controlled by energizing some sprayers at a rate greater than that of other sprayers.

Combining the sprayers' adjustable height with their ability to control flow rates, the fluid flow rates through each nozzle array (or, in fact, each nozzle) can be varied to suit the heat dissipated by a particular component, enables the maximizing of the thermal efficiency in the delivery of fluid to the surface of each hot component.

Preferably the nozzle array and components are oriented to minimize the interaction between the vapor rising off the component and the drop. More particularly, preferably the vapor will rise in a direction canted to, or substantially perpendicular to, the spray direction so as to minimize its effect (particularly in reducing velocity) on the sprayed drops. To this end, the nozzle arrays can be positioned and or configured to spray droplets that travel in a direction that is not vertically downward, so that the vapor will not rise toward the nozzle arrays in a direction parallel to the spray (see, e.g., FIGS. 2 and 3 where the sprayers spray laterally with respect to gravity). This feature is applicable for a wide variety of sprayer systems, both modular and otherwise.

This feature can be accomplished in a number of ways. One preferred way when using a perpendicular sprayer (i.e., one that sprays perpendicular to the surface of its nozzle array), is to cant the angle of the sprayer surface with respect to the sprayed surface, and locating the nozzle array at least partly offset from the component's sprayed surface. When the sprayed surface is horizontal with respect to gravity, this allows vapor to rise in a direction normal to the sprayed surface, while not impinging back onto (or only impinging on part of) the sprayer. In a somewhat similar alternative to this system, the sprayer's surface can be parallel to and offset from the sprayed surface, while using nozzles that spray toward the sprayed surface at an angle canted to the sprayed surface.

Figure 5:
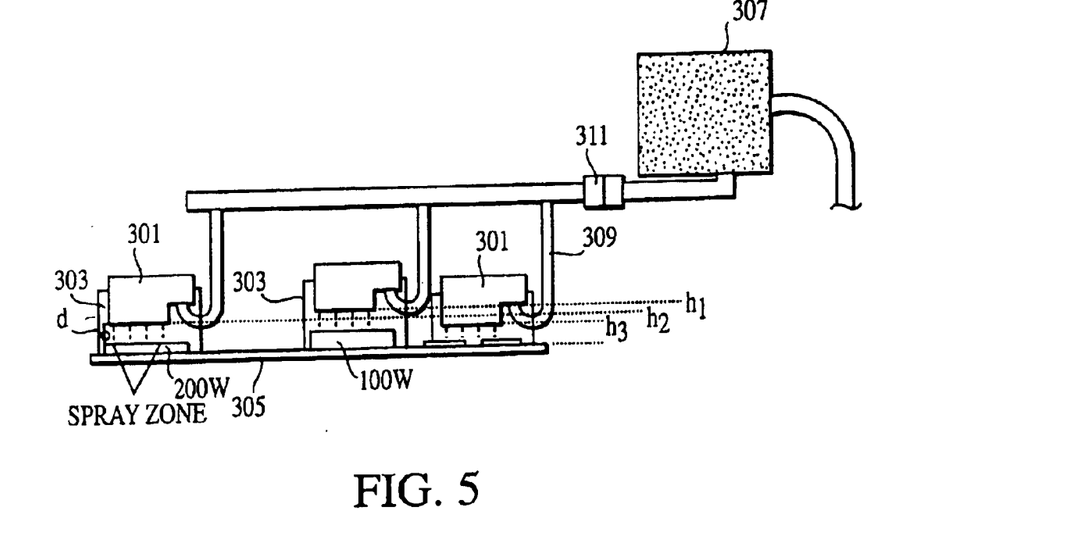
FIG. 5 is a variation of a sprayer mounting system that could be used in the first modular connection system depicted in FIG. 2.

With reference to FIG. 5, in a variation of this first embodiment, the sprayers 301 are mounted on one or more brackets 303 attached to the printed circuit board 305. The height of the sprayers off the printed circuit board can be adjusted up and down along slots in the bracket. Each cartridge is placed in fluid communication with a reservoir 307, via a preferably flexible tube 309 that flexes when the height of the sprayers is adjusted. The reservoir is preferably attached to the enclosure, and a connector 311 connects the flexible tubes to the reservoir such that the fluid connection between the sprayers and the reservoir is completed when the printed circuit board, carrying the sprayers, is inserted into the enclosure.

In either of the above variations of the module, the cartridges preferably can be easily replaced should they become damaged by having quick disconnects that connect the tubing to the cartridge, e.g., the types used in inkjet printers and plotters. Likewise the connections to the brackets can be made as quick-disconnects.

Likewise, in either of the above variations, the enclosure 105 (see FIGS. 2 and 3) is preferably configured to form a cooling-fluid retention basin 141 (i.e., a tray) that extends below the lowest point of the opening. The tray is configured to hold and retain all cooling fluid within the chamber 111 (with respect to gravity) when the board is being inserted or extracted, or the system is otherwise not in use. To prepare the board for use, the system preferably includes vacuum system (not shown) that partially or entirely evacuates the chamber after the door is sealed over the orifice.

To change a malfunctioning (or soon to be malfunctioning) printed circuit board, or to upgrade a printed circuit board, the board and its cooling system are deactivated. This preferably can occur with or without deactivating the remainder of the computer system. The door is then opened or removed, with the vacuum seal (if one exists) being broken either before or when the door is opened. The printed circuit board is then removed, preferably by simply pulling on the board to disengage the connectors. Alternatively, either a mechanical cam with an actuation lever can be used to dislodge the board, or a motorized device can dislodge and/or disgorge the board. A new board is then inserted and preferably pushed into place to engage the electrical connector (and the cooling fluid connector if the variation depicted in FIG. 5 is used). The guides to help guide the replacement printed circuit board into the module along the appropriate path, and to the correct location. The door is closed or attached, and the vacuum is reestablished if the cooling is to occur in a vacuum. The printed circuit board is then reactivated, and the cooling system is activated either prior to or concurrently with (or at least by the time it is needed after) the printed circuit board activation.

Figure 6:
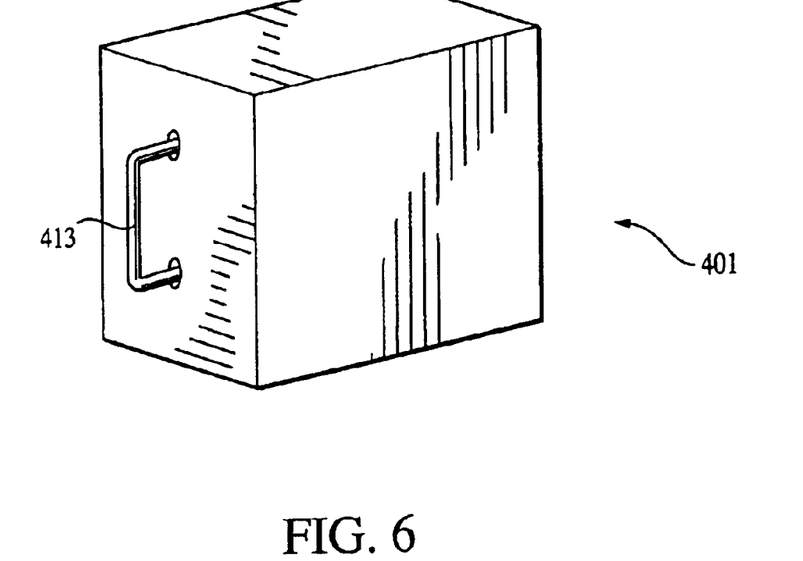
FIG. 6 is a perspective view of a second modular sprayjet cooling system embodying the invention.
Figure 7:
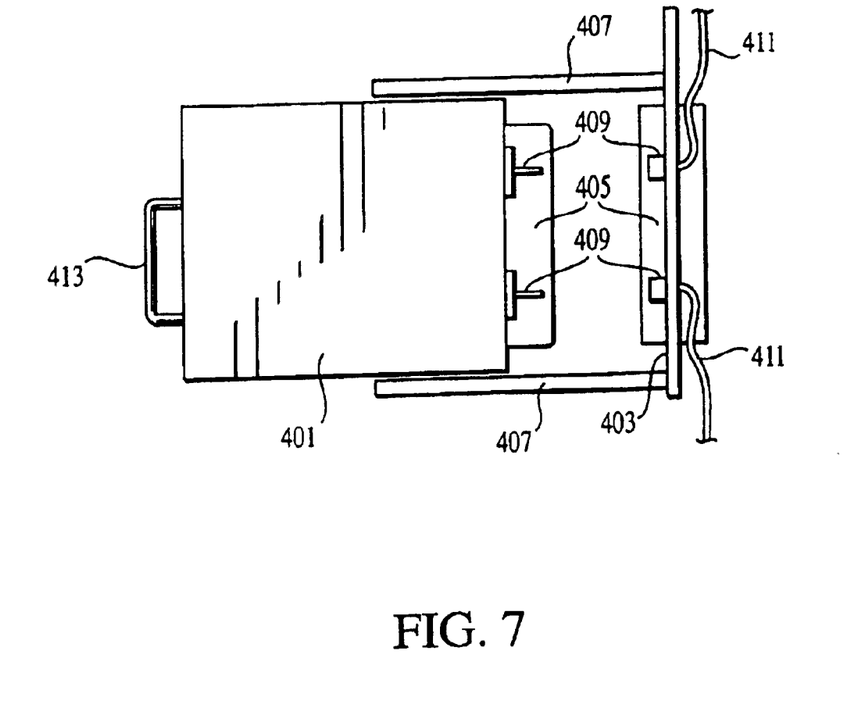
FIG. 7 is a side elevational view of the second modular connection system as depicted in FIG. 6.

With reference to FIGS. 6 and 7, in a second embodiment of the invention, a removable, preferably sealed, partially or totally self-contained modular sprayjet cooling system 401 connects to, and inserts into a bay 403 within a case of an electronic device such as a computer system via an appropriate mateable pair of quick-connect electrical connectors 405 (e.g., PC board connectors). The electronic device preferably includes a plurality of bays for receiving a plurality of such modules. The bays are preferably configured such that the modules can be inserted into and removed from the bays without any disassembly of the rest of the electronic device (or only insubstantial access-related activities such as opening an access door).

The module 401 preferably contains electrical and spray-cooling infrastructures (not shown) as described for the first embodiment, including the different variations of spray cooling height adjustment brackets. While variations of the module could include a quick-release type of opening, it preferably includes a sealed opening of the type that would normally only be opened at a factory location during manufacture or refurbishment. Additionally, while the module could include a vacuum system to evacuate the chamber, preferably the chamber is evacuated when the board is installed, and the sealed chamber maintains the vacuum.

The electrical device includes support guides 407 such that this embodiment of modular sprayjet cooling system, along with its internal printed circuit board, can be easily inserted and connected to the electrical device. The module can include a condenser and/or pump to make the cooling system entirely self contained. Alternatively, the embodiment can include first and second fluid connection ports 409 to provide access to lines 411 that connect with an external condenser and/or pump. Preferably these fluid connection ports are configured as quick release connections, and preferably they seal when not connected to maintain an airtight seal both within the module and within the lines 411 that connect with an external condenser and/or pump. The fluid connection ports can be similar to those used in inkjet plotters. If the ports are used, the external condenser and/or pump are preferably configured to support a plurality of modules, which most likely all operate within the computer system.

To change a malfunctioning (or soon to be malfunctioning) printed circuit board, or to upgrade a printed circuit board, the entire module 401, including its board and cooling system, is deactivated. This preferably can occur with or without deactivating the remainder of the electronic device. The module is then grasped, preferably by a handle 413, and removed from the electronic device, preferably by simply pulling on the module to disengage the module from the electronic device's electrical connector 405 (and the fluid connection ports 409 if they are provided). Alternatively, either a mechanical cam with an actuation lever can be used to dislodge the module, or a motorized device can dislodge and/or disgorge the module. A new module is then provided, inserted and preferably pushed into place to engage the connectors. The module is then reactivated, and the cooling system activates, either before or concurrently with (or slightly after) the board activation.

Preferred embodiments of the above-described invention can provide a sprayjet cooling system featuring a flexible fluid delivery scheme enabling optimal nozzle to surface spacing for a multiplicity of components on a single circuit board. This scheme can be compatible with current inkjet (thermal or piezoelectric) cartridges for ease of manufacture and limited costs. Under the present invention, many embodiments will offer expedient serviceability of cartridges via quick disconnects.

It is to be understood that the invention comprises apparatus and methods for designing cooling systems and for producing cooling systems, as well as the apparatus and methods of the cooling system itself. Additionally, the various embodiments of the invention can incorporate various combinations of these features with computer systems and/or other systems incorporating spray cooling of hot components. Alternate variations of these embodiments could comprise other types of incremental spraying mechanisms, such as piezoelectric sprayers, or other spraying mechanisms. Also, the above apparatus and methods could be adapted for use with other types of heat-producing components, such as in optical devices and the like. In short, the above disclosed features can be combined in a wide variety of configurations within the anticipated scope of the invention.

Furthermore, embodiments of the invention can incorporate various combinations of the spray cooling apparatus described in U.S. Pat. No. 6,205,799, which is incorporated herein by reference for all purposes. For example, the cooling system can use pooling sensors, as are described in the patent. Likewise, a spring mechanism in the reservoir could be used to assist in the feeding of cooling fluid to the sprayers.

While particular forms of the invention have been illustrated and described, it will be apparent that various modifications can be made without departing from the spirit and scope of the invention. Thus, although the invention has been described in detail with reference only to the preferred embodiments, those having ordinary skill in the art will appreciate that various modifications can be made without departing from the scope of the invention. Accordingly, the invention is not intended to be limited by the above discussion, and is defined with reference to the following claims.

We claim:

1. A modular sprayjet cooling system for cooling one or more components on a board by spraying the one or more components with a cooling fluid during operation of the one or more components, comprising:
    an enclosure defining an internal chamber, the chamber being configured to contain the board, wherein the chamber can be readily opened and closed by hand for external access to the chamber;
    an electrical connector located within the chamber, the electrical connector being configured to electrically connect to the board to enable the operation of the one or more components;
    a sprayer located within the chamber, the sprayer being configured to spray the one or more components with the cooling fluid; and
    a fluid connection port configured to provide fluid communication between the enclosure and an external condenser;
    wherein when the chamber is opened, the board can be readily removed and replaced by hand; and
    wherein when the chamber is closed, the chamber is sealed such that cooling fluid cannot leak out of the chamber.

2. The modular sprayjet cooling system of claim 1, and further comprising a condenser in fluid communication with the enclosure via the fluid connection port.

3. The modular sprayjet cooling system of claim 1, and further comprising:
    a second sprayer located within the chamber, the second sprayer being configured to spray the one or more components with the cooling fluid; and
    an adjustment mechanism configured to support the second sprayer at a distance from the board that is adjustable relative to the distance between the first sprayer and the board.

4. The modular sprayjet cooling system of claim 3, wherein the adjustment mechanism includes a bracket that connects the second sprayer to the enclosure.

5. The modular sprayjet cooling system of claim 3, wherein the adjustment mechanism includes a bracket that connects the second sprayer to the board.

6. The modular sprayjet cooling system of claim 1, wherein the sprayer is an incremental sprayer.

7. The modular sprayjet cooling system of claim 6, wherein the sprayer is a thermal inkjet-type sprayer.

8. An electronic device comprising a modular sprayjet cooling system as recited in claim 1.

9. The electronic device of claim 8, and further comprising a second modular sprayjet cooling system as recited in claim 1.

10. A modular sprayjet cooling system for cooling one or more components on a board by spraying the one or more components with a cooling fluid during operation of the one or more components, comprising:
    a means for enclosing the board, wherein the means for enclosing can be readily opened and closed by hand for external access to the enclosed board so as to allow the board to be readily removed and replaced by hand;
    a means for electrically connecting the enclosed board to enable the operation of the one or more components;
    a means for spraying the one or more components with the cooling fluid; and
    a means for allowing sprayed cooling fluid to be passed between the means for enclosing and an external cooling unit;
    wherein when the means for enclosing is closed, it is sealed such that cooling fluid cannot leak out of the means for enclosing.

11. A method for cooling one or more components on a board by spraying the one or more components with a cooling fluid during operation of the one or more components, comprising:
    enclosing the board in an enclosure, wherein the enclosure can be readily opened and closed by hand for external access to the enclosed board so as to allow the board to be readily removed and replaced by hand, and wherein when the enclosure is closed, it is sealed such that cooling fluid cannot leak out of the enclosure;
    electrically connecting the enclosed board to enable the operation of the one or more components;
    spraying the one or more components with the cooling fluid; and
    circulating the sprayed cooling fluid through an external condenser via a fluid connection port configured to provide fluid communication between the enclosure and an external condenser.

12. A method for electrically connecting a board having one or more components to an electrical connector of an electronic device, and for providing the board with a cooling fluid for cooling the one or more components via a device fluid connection port, comprising:
    inserting the board into an enclosure defining an internal chamber, the enclosure including a first electrical connector configured to electrically connect to the inserted board, a second electrical connector in electrical communication with the first electrical connector, a sprayer configured to spray the one or more components on the inserted board with the cooling fluid, and an enclosure fluid connection port;

sealing the chamber such that cooling fluid cannot leak out of the chamber; and inserting the enclosure into a bay in the electronic device, wherein the second electrical connector is configured to mate with the electrical connector of the electronic device when the enclosure is inserted into the bay, and wherein the enclosure fluid connection port is configured to mate with the device fluid connection port when the enclosure is inserted into the bay.

13. A method for cooling one or more components on a board, comprising:

adjusting the spray height of a first sprayer configured to spray cooling fluid on the one or more components with respect to the spray height of a second sprayer configured to spray the one or more components with the cooling fluid; and spraying the one or more components with cooling fluid from the first and second sprayers during operation of the one or more components.

14. An apparatus for cooling one or more components on a board, comprising:

a first means for spraying the one or more components with cooling fluid during operation of the one or more components;

a first means for spraying the one or more components with cooling fluid during operation of the one or more components; and a means for adjusting the spray height of the first means for spraying with respect to the spray height of the second means for spraying.

* * * * *